(12) United States Patent
Su et al.

(10) Patent No.: US 8,125,136 B2
(45) Date of Patent: Feb. 28, 2012

(54) LIGHT EMISSION DIODE

(75) Inventors: Wen-Lung Su, Hukou Township, Hsinchu County (TW); Hsiang-Cheng Hsieh, Hukou Township, Hsinchu County (TW)

(73) Assignee: Lextar Electronics Corp., Hsinchu (TW)

( * ) Notice: Subject to any disclaimer, the term of this patent is extended or adjusted under 35 U.S.C. 154(b) by 558 days.

(21) Appl. No.: 11/656,005

(22) Filed: Jan. 22, 2007

(65) Prior Publication Data
US 2008/0151557 A1 Jun. 26, 2008

(30) Foreign Application Priority Data
Dec. 22, 2006 (TW) ................ 95222669 U

(51) Int. Cl.
*H01L 51/00* (2006.01)

(52) U.S. Cl. .................. 313/498; 313/506
(58) Field of Classification Search ........... 313/498–512
See application file for complete search history.

(56) References Cited

U.S. PATENT DOCUMENTS
6,670,648 B2 * 12/2003 Isokawa et al. ............. 257/99
* cited by examiner

*Primary Examiner* — Anne Hines
(74) *Attorney, Agent, or Firm* — Liu & Liu

(57) ABSTRACT

A light emitting diode includes a casing, a frame in the casing, one or a plurality of light emitting chip, and a packaging polymer; the frame being provided with a placement area to receive placement of the light emitting chip, and an electrode area separated from the placement area; a sectional fall being disposed at where appropriately on the placement area to increase contact area between the frame and the casing and improve the relative stability between the casing and the frame.

9 Claims, 10 Drawing Sheets

LIGHT EMISSION DIODE

BACKGROUND OF THE INVENTION (a) Field of the Invention

The present invention is related to a light emitting diode (LED), and more particularly, to one that is capable of helping secure the casing in relation to the frame and improving heat sink effects.

(b) Description of the Prior Art

Whereas a light emitting diode is related to a light emitting device comprised of semi-conductor that produces spectra of different frequency by emitting photons as a result of having the electrons incorporated with electron holes in the semiconductor crystal. That is, when a light emitting chip of integrated n-type semiconductor crystal and p-type semiconductor crystal conducts, extra electrons from the n-type semiconductor crystal will flow into the electron holes in the p-type semiconductor crystal; and energy is released when electrons from the n-type conductor crystal flow into electron holes in the p-type semiconductor crystal due to differences in potentials. The energy is released in the form of light to produce streams of light indifferent wavelengths.

As illustrated in FIG. 1 of the accompanying drawing showing a basic configuration of a light emitting diode generally available in the market, the light emitting diode 1 is provided with a frame 11; the frame 11 is separately disposed with two carriers 111; a light-emitting chip 12 is fixed to one carrier 111 with conductive or non-conductive film or in eutectic fashion before having a golden plated wire 13 (or any conductor providing the equivalent conductive function) to connect the light emitting chip 12 and each carrier 111 so to apply different voltages between two frames for creating two carriers 111 respectively carrying positive and negative electrodes for releasing energy to emit light through a combination of electrons and electron holes.

However, as illustrated in FIG. 2, in molding the frame 11, two carriers 111 corresponding to each other without connection are punched on a straight and flush metal material band, followed with the formation of a plastic casing 14 by injection within the area defined by both carriers 111, and a section for multiple pins 15 with each in a given shape are punched on the section of the plastic casing 14 extending from the carrier 111. Then one or a plurality of punching cores is provided to cause the section of pins 15 to bend toward a pre-determined position corresponding to the plastic casing 14 to become an integral construction of multiple pins 15 for the carrier 111 to secure the light emitting chip and to fill fluorescent material or packaging material into the plastic casing 14 of the light emitting frame.

Nonetheless, the frame 11 is related to a straight and flush structure and when the plastic casing 14 is formed on the area of two carriers 111, the positioning effect by contact between the plastic casing and the frame 11 is comprised of two straight and flush contact planes resulting in poor positioning effect since both of the frame 11 and the plastic casing 14 are vulnerable to separating from each other. Furthermore, as the light emitting diode 12 of the light emitting diode is functioning, the heat produced fails to be effectively dissipated In turn, the temperature of the entire LED can keep on rising until the LED fails.

SUMMARY OF THE INVENTION

The primary purpose of the present invention is to provide an improved construction of a light emitting diode to correct the problem of the defects of the prior art by helping secure the casing in relation to the frame and improving heat sink effects.

To achieve the purpose, the present invention includes a casing, a frame in the casing, one or a plurality of light emitting chips, and a packaging polymer; the frame provides a placement area to receive the light emitting chip, and an electrode area separated from the placement area; and a step portion is disposed at where appropriately on the placement area to increase the contact area between the casing and the frame while improving the stability of relative positioning between the casing and the frame.

Furthermore, the placement area is in a thickness greater than that of the electrode area, and an opening is provided at the bottom of an accommodation recess in relation to the placement area to expose the bottom of the placement area out of the casing; so that when the light emitting chip is placed on the placement area, the placement area absorbs the heat generated by the light emitting chip during its operation. The heat absorption and dissipation effects executed by the metallic material will dissipate the heat through the opening thus for the light emitting diode to maintain its working temperature without being damaged due to overheating.

Another purpose of the present invention of an improved structure of a light emitting diode is to allow both of the placement area and the electrode area to extend to the outer side of the casing through the accommodation recess. To achieve the purpose, the light emitting diode also contains the casing, the frame in the casing, one or a plurality of light emitting chip, and the packaging polymer; the frame is provided with the placement area to receive the light emitting chip; the electrode area separate from the placement area; a protruding portion outwardly extends from the side of the placement area; a supporting portion outwardly extends from the side of the electrode area; and both of the protruding portion and the supporting portions allow the placement area and the electrode area to extend from the accommodation recess to the outer side of the casing.

DETAILED DESCRIPTION OF THE PREFERRED EMBODIMENTS

Figure 1:
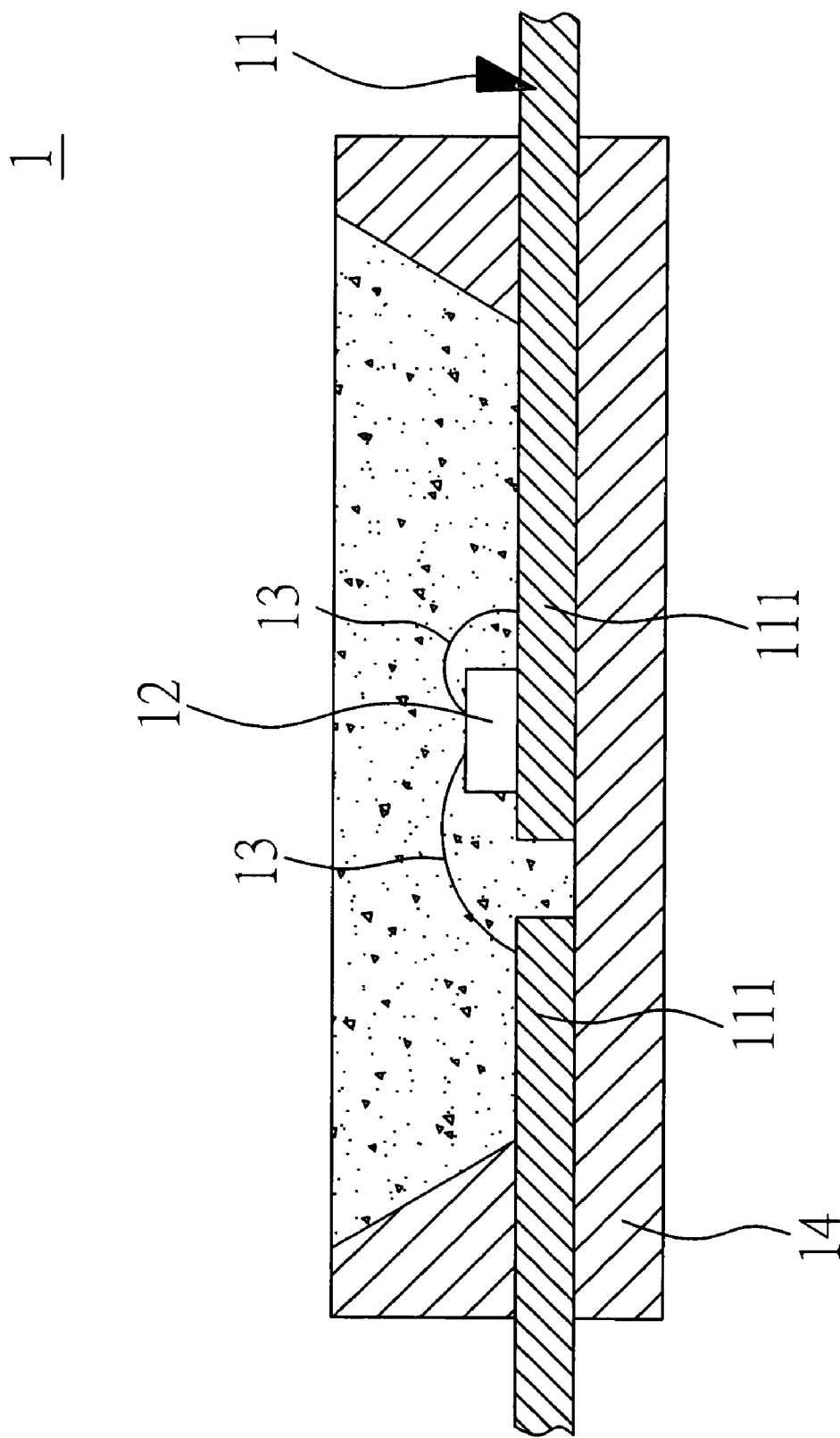
FIG. 1 is a perspective view showing a construction of a light emitting diode of the prior art.
Figure 2:
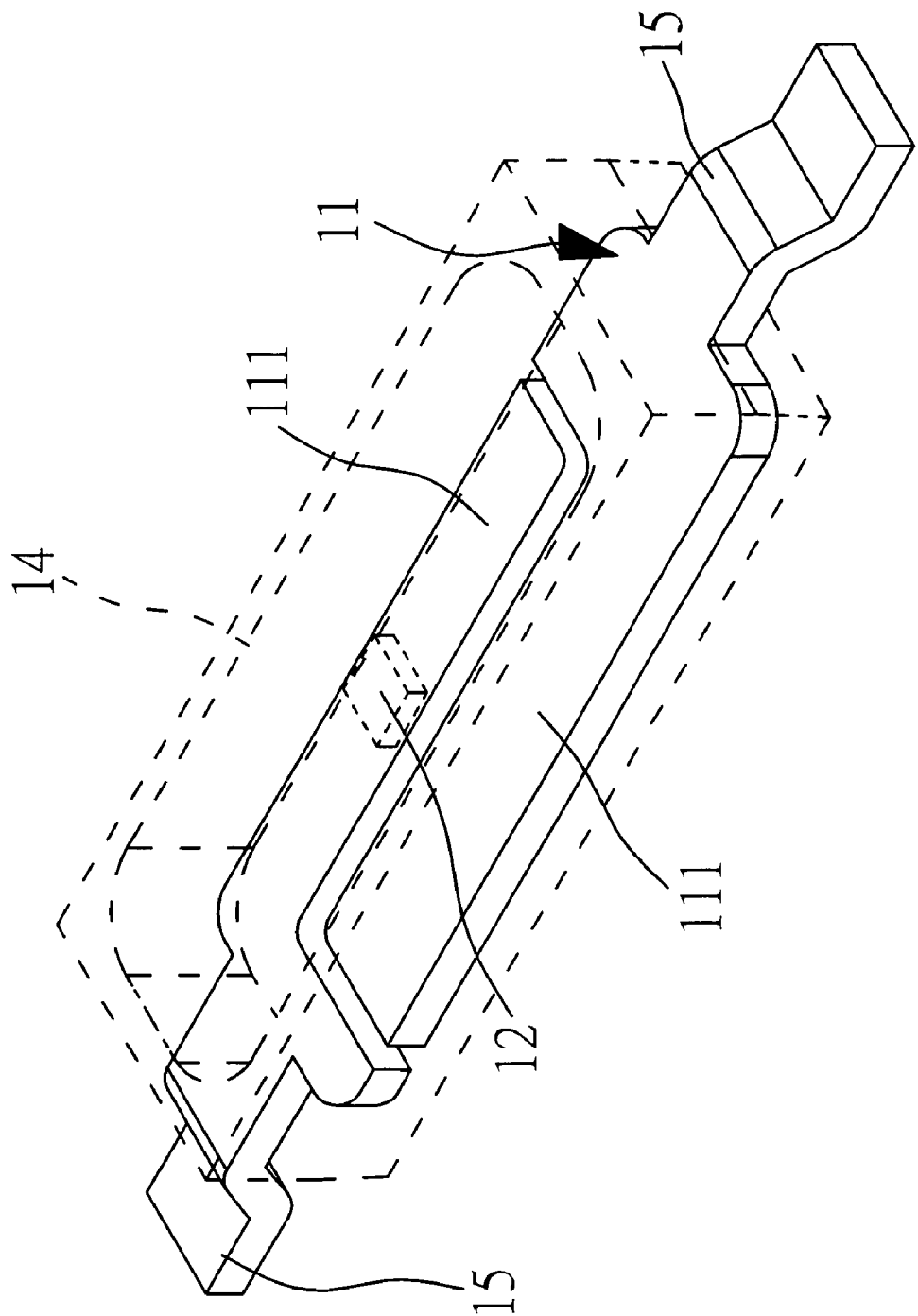
FIG. 2 is a schematic view showing the construction of the light emitting diode of the prior art.
Figure 3:
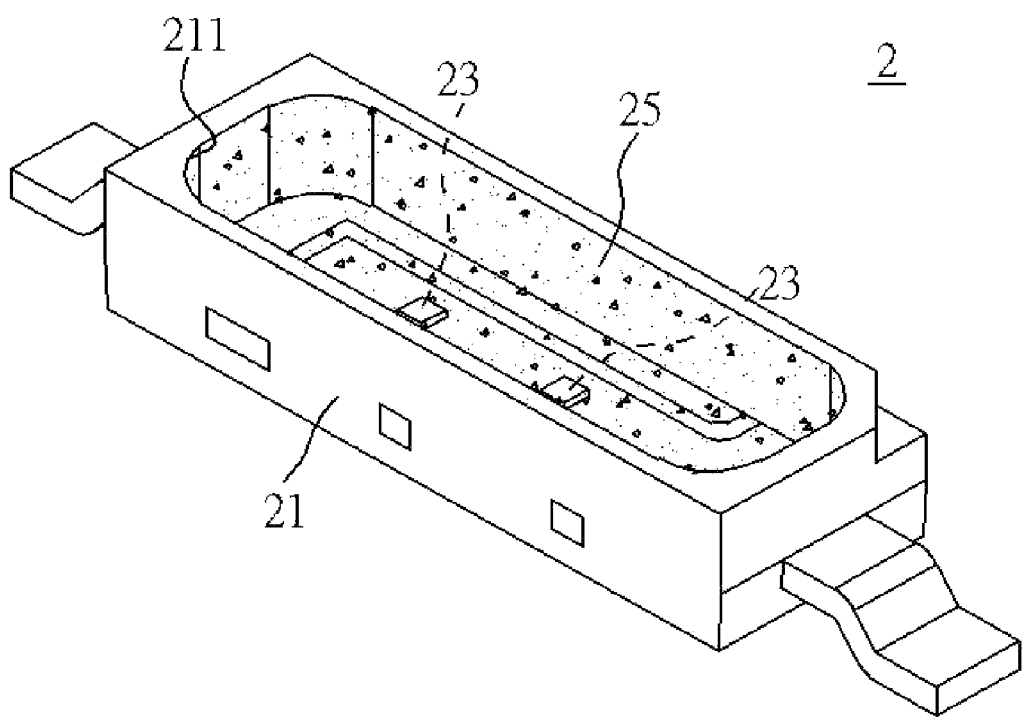
FIG. 3 is a perspective view of a light emitting diode of the present invention.
Figure 4:
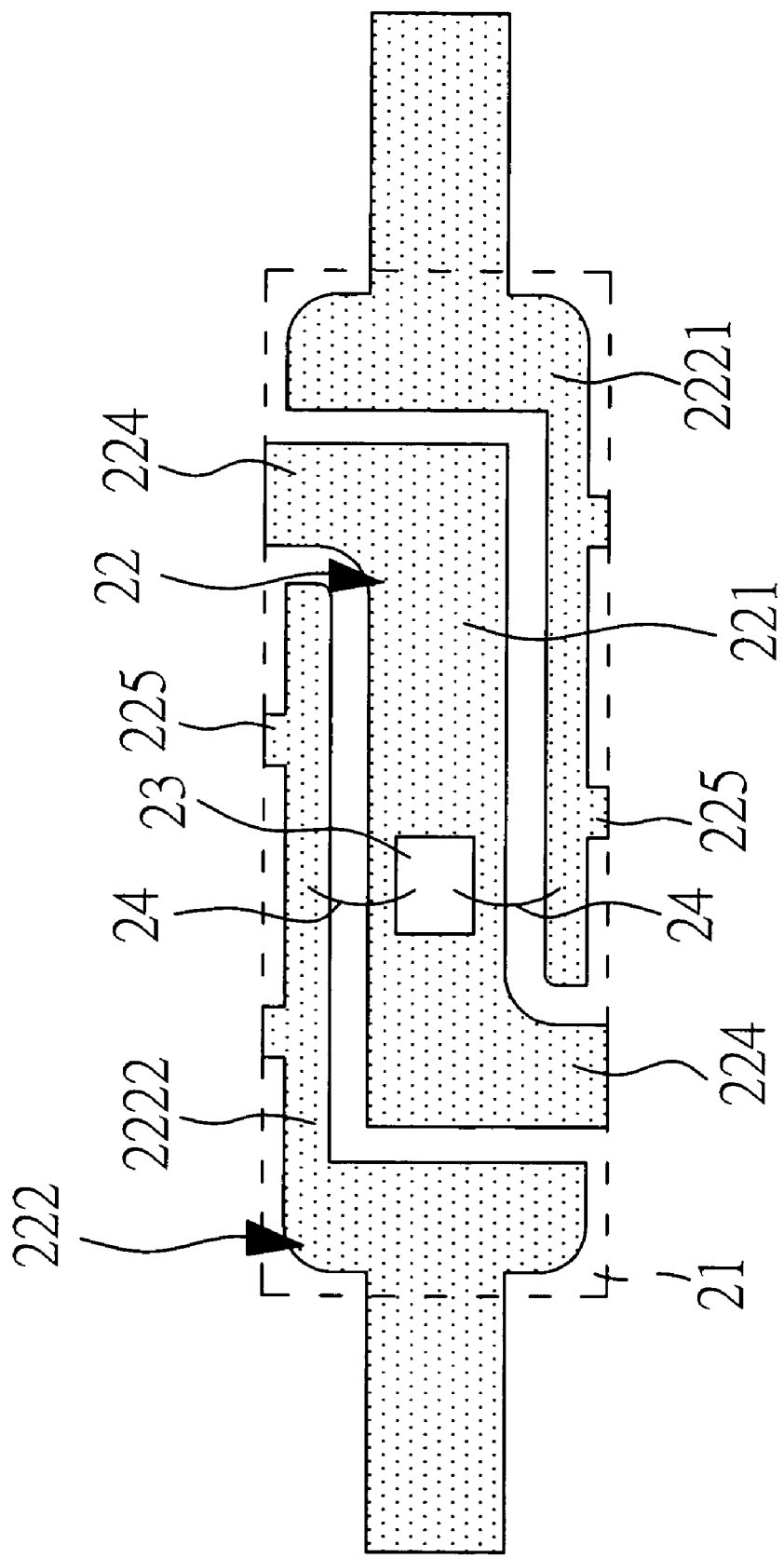
FIG. 4 is a schematic view showing a layout of frame and light emitting chip in the present invention.
Figure 5:
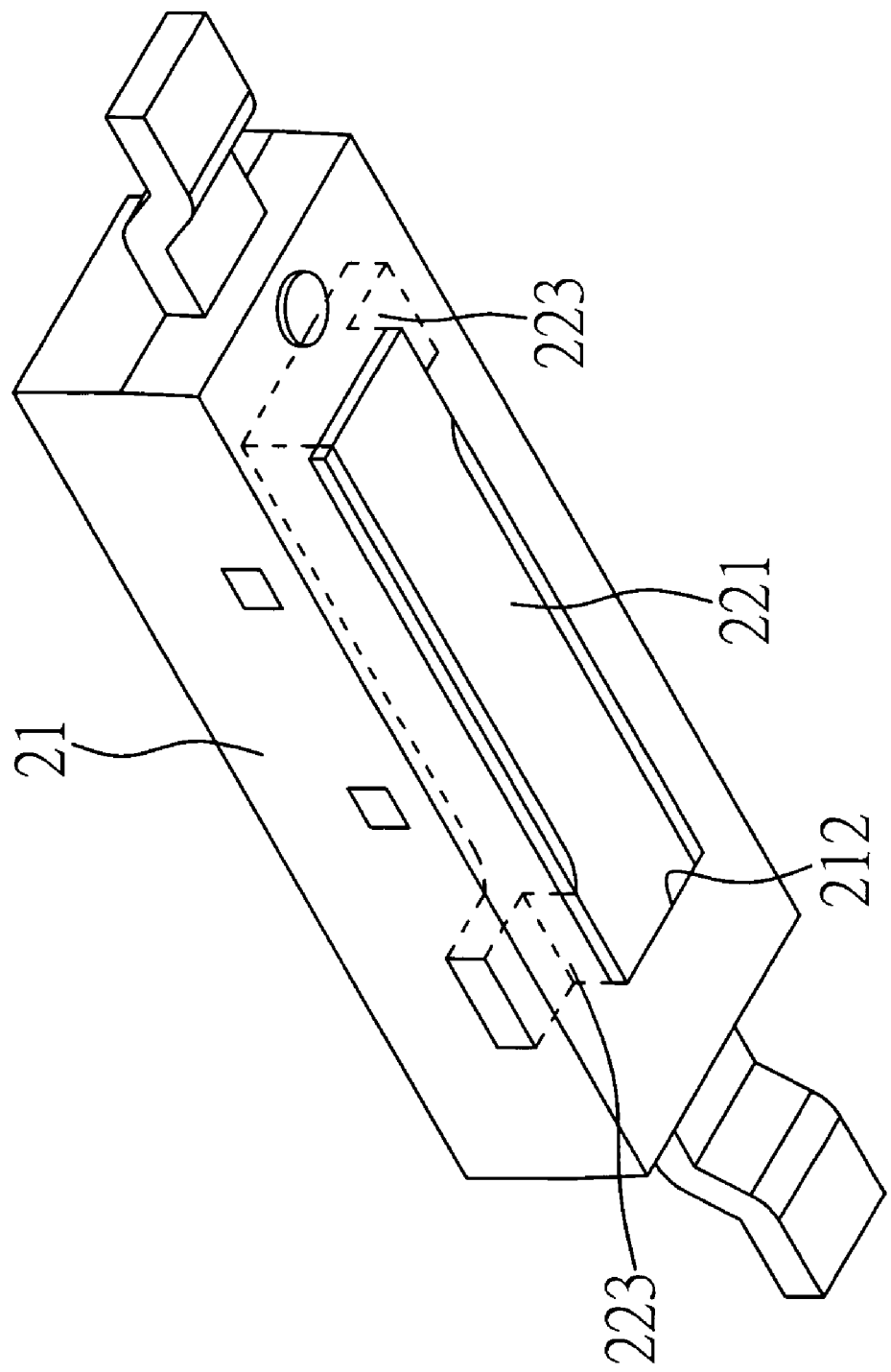
FIG. 5 is another perspective view of the light emitting diode of the present invention.

Referring to FIGS. 3, 4, and 5 for a preferred embodiment of the present invention, a light emitting diode 2 includes a casing 21 containing a frame 22 and the casing is provided with an accommodation recess 211 to expose the frame 22.

The frame 22 is provided with a placement area 221 to receive a light-emitting chip 23, and an electrode area 222 separate from the placement area 221. A step portion area 223 is disposed appropriately on the placement area 221. As illustrated, the step portion 223 is disposed at the bottom of the placement area 221. A protruding portion 224 extends from one side of the placement area 221 so that the side of the placement area becomes a non-flush structure. The electrode area 222 is comprised of one or a plurality of pair of positive and negative electrode areas 2221, 2222 that are separated from each other by polarity.

One or a plurality of light emitting chips 23 is placed on the placement area 221 and electrically connected respectively to the positive and negative electrode areas 2221, 2222 by means of a conductor 24. A packaging polymer 25 is disposed in the accommodation recess 211.

The frame 22 is comprised of the placement area 221 and the electrode area 222 with both areas each molded with a metallic material band. The step portion 223 is formed at the bottom of the placement area 221. Also referring to FIG. 6(A), the protruding portion 224 extends from one side of the placement area 221 so that the side of the placement area becomes a non-flush structure. When the casing 21 is molded on the frame, the step portion 223 and the protruding portion 224 increase the contact area between the casing 21 and the frame 22 and helps prevent both of the casing 21 and the frame 22 from being separated from each other.

Figure 6A:
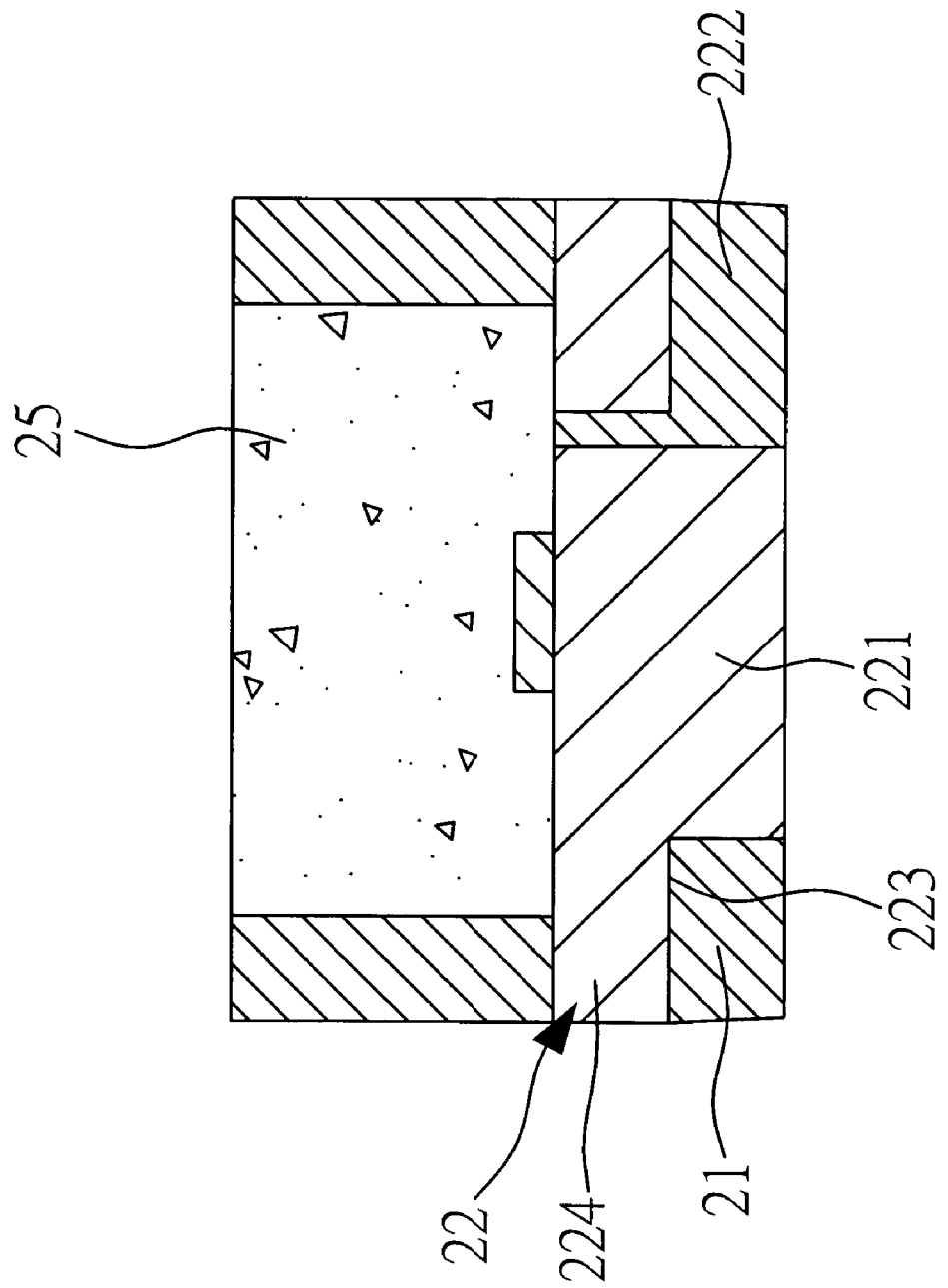
FIGS. 6(A) and 6(B) are sectional views showing a construction of the light emitting diode of the present invention.
Figure 6B:
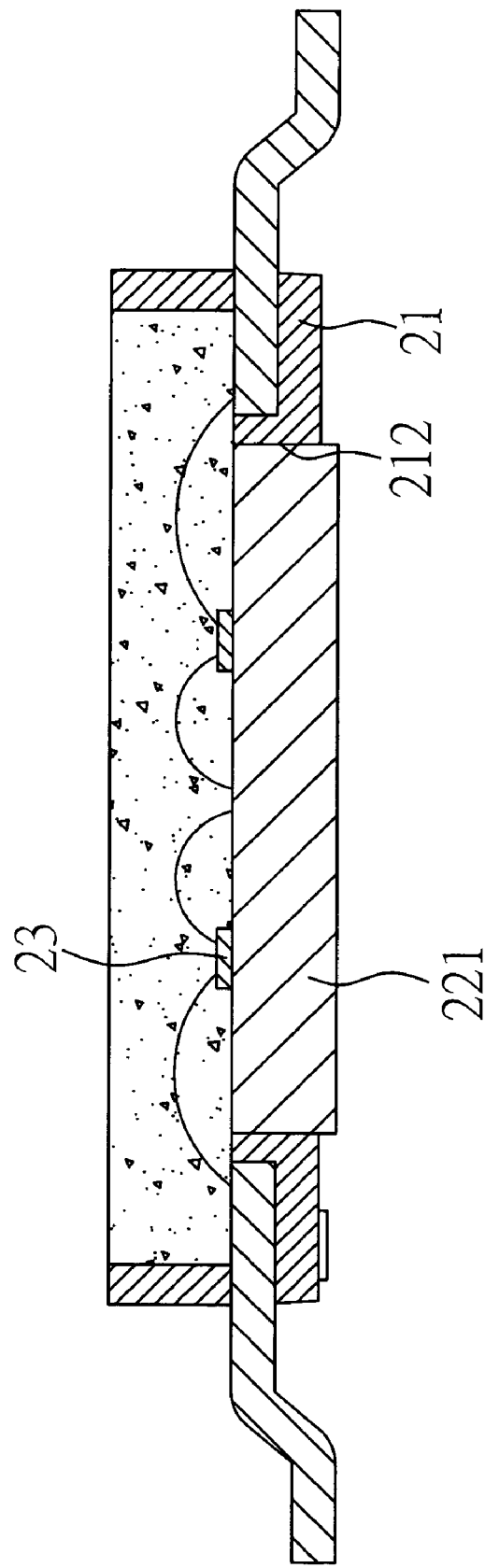

Furthermore, the thickness of the placement area 221 is greater than that of the electrode area 222 as illustrated in FIG. 6(A). An opening 212 is formed on the bottom of the accommodation recess 211 in relation to the placement area 221 so to expose the bottom of the placement area out of the bottom of the casing 21 while the bottom of the placement area 221 and the bottom of the casing 21 are on the same plane. When the light emitting chip 23 is placed on the placement area 221, the placement area 221 absorbs the heat generated by the light-emitting chip 23 during its operation. The heat is dissipated from the placement area 221 where the opening 212 is disposed due to the heat absorption and dissipation effects provided by the metallic material for the light emitting diode 2 to maintain its working temperature without being damaged due to overheating. Of course, the bottom of the placement area 221 may also slightly protrude from the bottom of the casing 21 as illustrated in FIG. 5.

Figure 7:
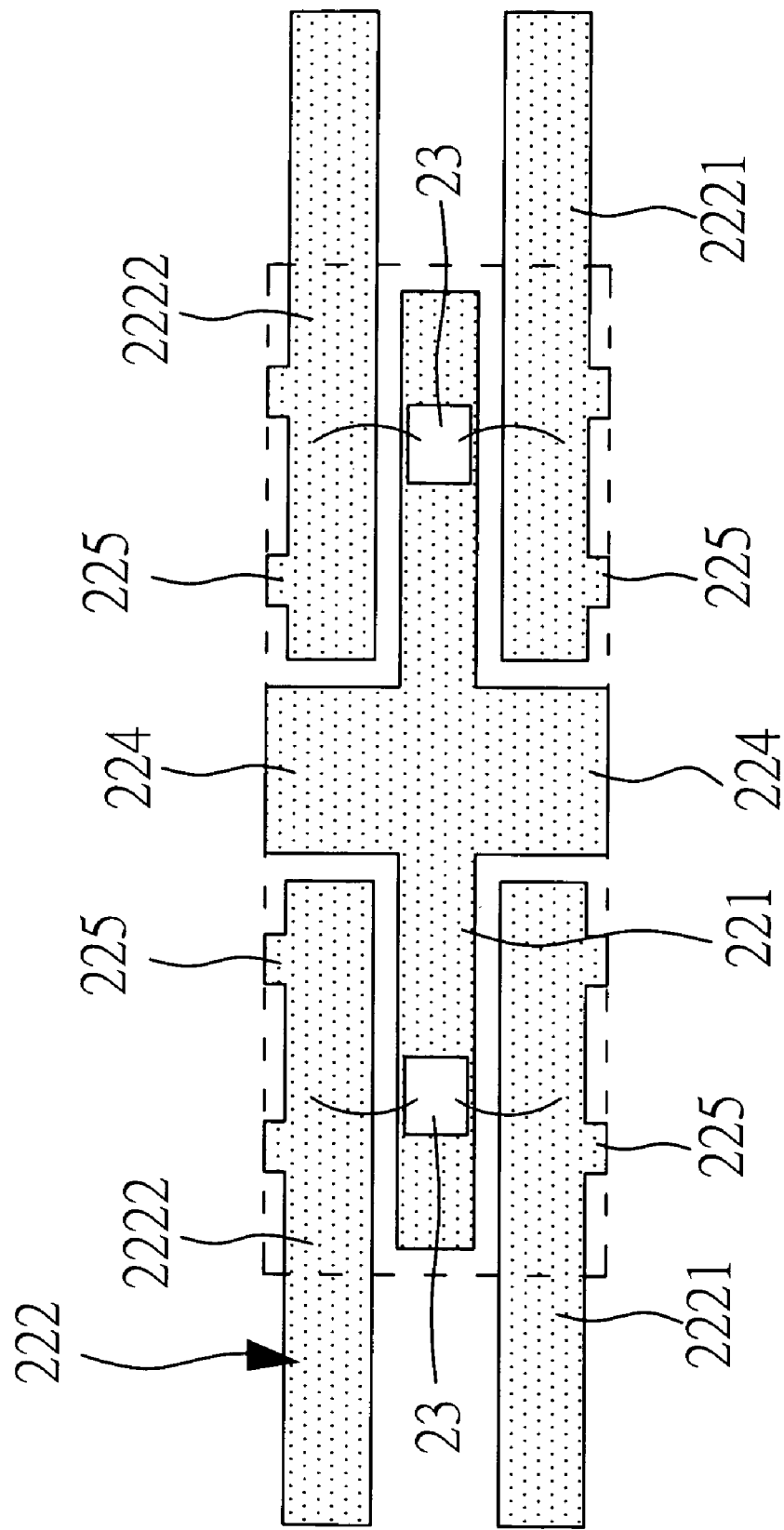
FIG. 7 is another schematic view showing a layout of the frame and the light-emitting chip of the present invention.

The electrode area 222 may be related to one or a plurality of pair of positive and negative electrode areas with both areas separated from each other by polarity. As illustrated in FIG. 7, two sets of positive and negative electrode areas 2221, 2222 are provided in the electrode area 222 with both positive and negative electrode areas 2221, 2222 being separated from each other by polarity.

Figure 8:
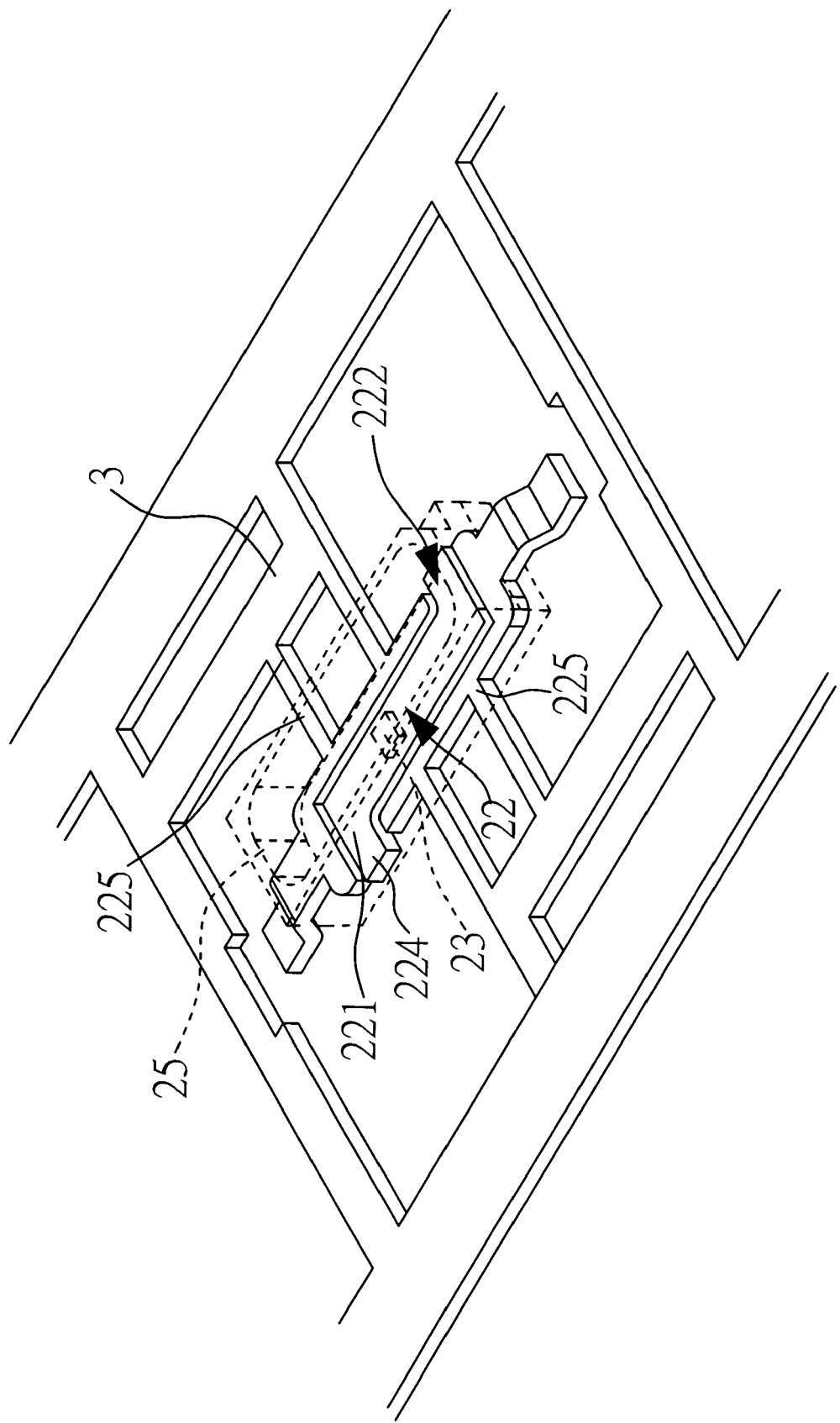
FIG. 8 is a perspective view showing a frame and a metallic material band in another preferred embodiment of the present invention.

As illustrated in FIG. 8 for another preferred embodiment of the present invention, the light emitting diode 2 also contains a casing 21 (represented by dotted line), the frame 22 in the casing 21, one or a plurality of light emitting chip 23, and the packaging polymer 25. The frame is comprised of the placement area 221 for placing the light-emitting chip 23 thereon, and the electrode area 222 that is separated from the placement area 221 with both areas 221, 222 made of a metallic material band 3. The protruding area 224 outwardly extends from one side of the placement area 221 and a supporting portion 225 outwardly extends from one side of the electrode area 222. The supporting portion 225 connects the frame 22 and the metallic material band 3.

Figure 9:
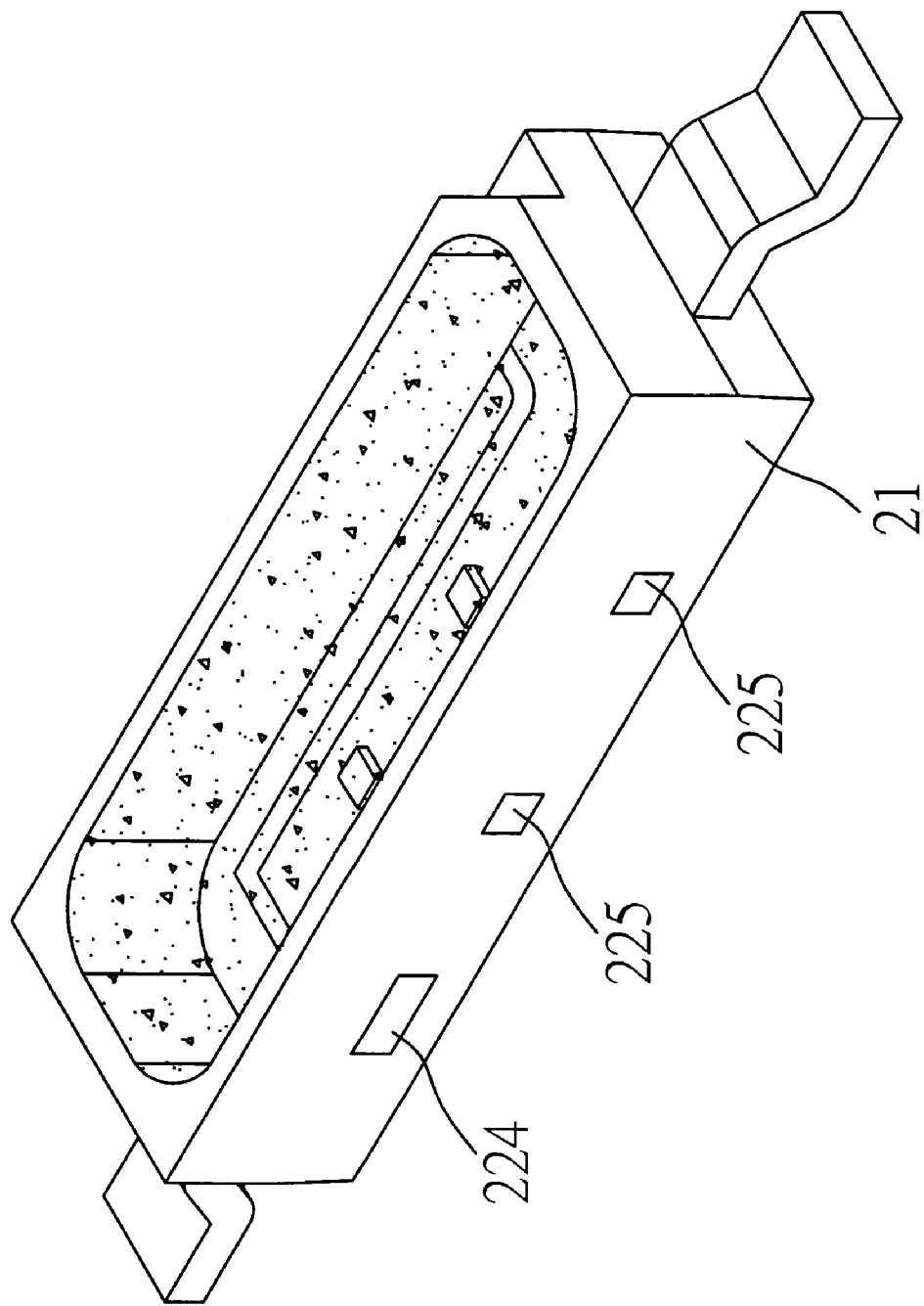
FIG. 9 is a perspective view showing a construction of another preferred embodiment of the present invention.

When the frame 22 is molded on the casing 21, the frame is held in position by means of the connection between the supporting portion 225 and the metallic material band 3 so to secure the relative positioning between the casing 21 and the frame 22. After the casing is molded, the frame 22 is separated from the metallic material band 3 to complete the construction of the light emitting diode as illustrated in FIG. 9 with the protruding portion 224 and the supporting portion 225 exposed out of the surface of the casing 21 to serve as a connecting point in the subsequent process.

As illustrated in FIG. 7, the electrode area 222 is comprised of one or a plurality of paired positive and negative electrode areas 2221, 2222 with both areas separated from each other by polarity. Two sets of the paired positive and negative electrode areas 2221, 2222 are provided in the preferred embodiment as illustrated. The supporting portion 225 outwardly extends from one side of each of the positive and negative electrode areas 2221, 2222; and the protruding portion 224 outwardly extends from one side of the placement area 221. Both of the protruding portion 224 and the supporting portion 225 are exposed out of the surface of the casing 21. When two light emitting chips indifferent colors from each other are placed on the placement area 221, each light emitting chip 23 is electrically connected respectively to the positive and the negative electrode areas 2221, 2222. Since the voltage needed by each light-emitting chip 23 varies due to different color (e.g., the voltage for white light, blue light, and green light is approximately at 3.0~3.5V; red light, 1.8~2.1; and yellow light, 2.0~2.4V), different voltages are respectively applied to both positive and negative electrode areas 2221, 2222 depending on the voltage needed by the individual light emitting chip 23 to prevent affecting the light mixing effects due to service life decay when improper voltage is applied to the light emitting chips 23 in different colors.

The prevent invention provides an improved structure of a light emitting diode, and the application for a utility patent is duly filed accordingly. However, it is to be noted that the preferred embodiments disclosed in the specification and the accompanying drawings are not limiting the present invention; and that any construction, installation, or characteristics that is same or similar to that of the present invention should fall within the scope of the purposes and claims of the present invention.

We claim:

1. A light emitting diode including a non-conductive casing and a conductive frame, the casing defining an accommodation recess to expose the frame such that two ends of the frame are exposed out of the casing;

the frame comprising a placement area to receive a light emitting chip and an electrode area separated from the placement area, wherein the placement area has a top surface for receiving the light emitting chip, a bottom surface spaced apart from the top surface so as to define a first thickness and a pair of protruding portions outwardly extending from the placement area, respectfully, the protruding portions having a second thickness, wherein the first thickness is substantially greater than the second thickness such that a step portion is formed adjacent the protruding portions, the step portion being located and configured to facilitate the engagement of the placement area with the casing wherein the light emitting chip is electrically connected to the electrode area with a conductor, and wherein a packaging polymer is provided in the accommodation recess.

2. The light emitting diode as claimed in claim 1, wherein the first thickness of the placement area is greater than that of the electrode area.

3. The light emitting diode as claimed in claim 1, wherein an opening is formed in the casing to expose the top surface of the placement area in the accommodation recess and wherein the bottom surface of the placement area is exposed out of the bottom surface of the casing.

4. The light emitting diode as claimed in claim 3, wherein the bottom surface of the placement area and the bottom surface of the casing are on the same plane.

5. The light emitting diode as claimed in claim 3, wherein the bottom surface of the placement area protrudes from the bottom surface of the casing.

6. The light emitting diode as claimed in claim 1, wherein the electrode area is comprised of one or a plurality of paired positive and negative electrode areas.

7. The light emitting diode of claim 6, wherein each of the positive and negative electrode areas has a top surface for connection to the conductor and at least one supporting portion extending outside of the casing.

8. The light emitting diode as claimed in claim 1, wherein respective ends of the protruding portions protrude through the casing to expose said ends of the protruding portions outside of the casing.

9. The light emitting diode as claimed in claim 1, wherein respective ends of the protruding portions are exposed outside of the casing through the casing.

* * * * *